US010352974B2

(12) United States Patent
Sansa Perna et al.

(10) Patent No.: US 10,352,974 B2
(45) Date of Patent: Jul. 16, 2019

(54) METHOD AND APPARATUS TO IMPLEMENT FREQUENCY STABILIZATION OF A RESONATOR (71) Applicant: COMMISSARIAT A L'ENERGIE ATOMIQUE ET AUX ENERGIES ALTERNATIVES, Paris (FR)

(72) Inventors: Marc Sansa Perna, Grenoble (FR); Sébastien Hentz, Seyssinet Pariset (FR); Guillaume Jourdan, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 127 days.

(21) Appl. No.: 15/189,967

(22) Filed: Jun. 22, 2016

(65) Prior Publication Data
US 2017/0370975 A1 Dec. 28, 2017

(51) Int. Cl.
*G01R 23/15* (2006.01)
*G01R 29/26* (2006.01)
*H03J 3/12* (2006.01)
*B81B 3/00* (2006.01)

(52) U.S. Cl.
CPC ............ G01R 23/15 (2013.01); G01R 29/26 (2013.01); H03J 3/12 (2013.01); *B81B 3/0032* (2013.01); *B81B 2201/0271* (2013.01)

(58) Field of Classification Search
CPC . G01R 23/15; G01R 29/26; H03J 3/12; B81B 3/0032

USPC ....................................................... 324/76.45
See application file for complete search history.

(56) References Cited

U.S. PATENT DOCUMENTS

| 3,766,540 | A | * | 10/1973 | Schopfer | ............ | G08B 13/1418 340/13.33 |
| 5,748,060 | A | * | 5/1998 | Sarkka | ...................... | H01P 7/10 333/219.1 |
| 5,839,062 | A | * | 11/1998 | Nguyen | ............. | H03H 9/02377 332/117 |
| 2003/0170912 | A1 | * | 9/2003 | Muravsky | .............. | G01R 33/60 436/518 |

(Continued)

OTHER PUBLICATIONS

D. Allan et al., "Standard Terminology for Fundamental Frequency and Time Metrology," 42nd Annual Frequency Control Symposium, 1988, pp. 419-425.

(Continued)

*Primary Examiner* — Jeff W Natalini
(74) *Attorney, Agent, or Firm* — Baker & Hostetler LLP (57) ABSTRACT

A method of characterizing frequency fluctuations of a resonator comprising the steps of: a) driving the resonator, in a linear regime, by simultaneously applying two periodical driving signals having respective frequencies, the frequencies being different from each other and from a resonant frequency of the resonator, but contained within a resonance linewidth thereof; b) performing simultaneous measurements of response signal of the resonator at the frequencies of the periodical driving signal; and c) computing a value representative of a correlation between the measurements, the value being indicative of frequency fluctuations of the resonator. An apparatus for implementing such a method is provided.

19 Claims, 6 Drawing Sheets

(56) References Cited

U.S. PATENT DOCUMENTS

| | | | | |
|---|---|---|---|---|
| 2004/0211260 A1* | 10/2004 | Girmonsky | ......... | A61B 5/0215 |
| | | | | 73/579 |
| 2005/0094150 A1* | 5/2005 | DePue | ..................... | G01J 3/42 |
| | | | | 356/445 |
| 2008/0285617 A1* | 11/2008 | Moldover | ............... | G01K 7/32 |
| | | | | 374/117 |
| 2011/0080579 A1* | 4/2011 | Pipino | ...................... | G01J 3/44 |
| | | | | 356/301 |
| 2011/0102095 A1* | 5/2011 | Steeneken | ............... | H03D 7/00 |
| | | | | 332/175 |
| 2017/0184644 A1* | 6/2017 | Vohra | .................... | G01R 23/02 |

OTHER PUBLICATIONS

E. Mile et al. "In-plane Nanoelectromechanical Resonators Based on Silicon Nanowire Piezoresistive Detection," Nanotechnology 2010, vol. 21, No. 16, pp. 165504.

\* cited by examiner

FIG. 1

(Prior art)

METHOD AND APPARATUS TO IMPLEMENT FREQUENCY STABILIZATION OF A RESONATOR

FIELD OF THE INVENTION

The present invention relates to the field of oscillators and resonators and more generally to any system with a frequency generation capability. For example, the oscillator may be optical, mechanical or electromechanical such as respectively for a laser, a vibrating beam and a crystal time reference.

Frequency generation has implications in many fields where preciseness and accuracy of the oscillating device is of concern. For example, the invention may apply to the field of Micro-Nano Electro-Mechanical Systems, including for instance Micro-Nano Optical Electro-Mechanical Systems (M-NEMS or M-NOEMS), for mass or force resonant sensor applications. The principle of a M-N(O)EMS as a mass detector sensor is the following: the deposition of a particle on top of the resonator will cause a resonant frequency shift proportional to the mass of the particle. This technique is based on a perturbative readout technique.

BACKGROUND

NEMS have demonstrated tremendous potential for applications such as ultrasensitive mass and force sensing. Nonetheless, because of their physical dimensions, their actuation and readout still remains as of today a challenge. It is known that their immediate surroundings can be the origin of the alteration of the extremely weak signals induced by their displacements.

In an M-NEMS system and in any oscillating system, frequency stability may be defined as the uncertainty of the measured frequency normalized to its mean value:

$$\frac{\partial f}{f_0}$$

where $\partial f$ is the instantaneous frequency deviation and $f_0$ the nominal frequency of the oscillator.

The extent to which M-NEMS sensors can resolve the mass of a particle is inherent to its resonant frequency stability and other properties including its mass. In such mass detection apparatus, the M-NEMS is part of a closed loop system forming an oscillator. When the resonance fluctuates, so does the oscillation frequency and it translates into frequency instability of the oscillator.

This stability is thought to reach a limit with the resonator's ability to resolve thermally-induced vibrations. Although measurements and predictions of resonator stability usually disregard fluctuations in the mechanical frequency response, these fluctuations have recently attracted considerable interest. However, their existence is very difficult to demonstrate experimentally.

To date, all measurements of their frequency stability report values several orders of magnitude larger than the limit imposed by thermomechanical noise. In such system, frequency instability of the oscillator may be caused by two phenomena, additive noise and intrinsic frequency fluctuations of the resonator. But there is no diagnostic tool or means to distinguish one phenomenon from another.

There are tools and means to characterize the frequency stability of an oscillating system. The document "Standard terminology for fundamental frequency and time metrology" authored by D. Allan et al. puts an emphasis on some of these tools. They are known as the Allan Deviation, the Power Spectral Density and the Phase Spectral Density. They are strongly related, complementary and globally show the same information but in a different manner and domain. Thus, processes such as random walk frequency, flicker frequency, white frequency, flicker phase and white phase noises may be identified with these tools. These diagnostic tools are extensively used by the frequency metrology community but are not always sufficient, such as in the case of the problem solved by the present invention.

The power spectral density is probably the most straightforward analysis. It is a direct measurement performed with a spectrum analyzer at the output of the device under test without any external measurement system. That said it is also the least effective in terms of identifying different types of noises processes.

The phase spectral density measurement is more complex to implement. One of the simplest ways by which it is obtained is with a residual phase noise measurement system. Two near identical devices under test are beat together while they are forming a phase bridge. A phase shifter placed in one of the arms of the bridge sets a quadrature between the output signals of the two devices. The zero beat (DC signal) containing phase fluctuations is then measured with a vector signal analyzer then plotted in a normalized one hertz bandwidth as a function of carrier offset frequencies.

The Allan Deviation is a statistical tool also called the two-sample variance. It is a measure of the variability of the average frequency of an oscillator between two adjacent measurement intervals. For example the variation measurement of a frequency beat between two near identical oscillators with a frequency counter. The measurement occurs over a certain period of time, during which the frequency counter probes repeatedly the intermediate frequency port of the mixer for an integration time of duration Tau.

SUMMARY OF THE INVENTION

The goal of the invention is to characterize the noise properties of a resonator by implementing an experimental method to distinguish between frequency fluctuations and additive noise. To address the resonator's frequency fluctuations issues, one needs to quantify these frequency fluctuations. The intrinsic frequency fluctuations of the resonator are embedded in the oscillations/resonance with additive noise. They both have the same effect on the entire system, which is a degradation of the frequency stability of the oscillator. To circumvent the issue, a method to distinguish the resonator's intrinsic frequency fluctuations from additive noise has to be implemented. Once these two phenomena are dissociated and quantified and if frequency fluctuations are dominating it is then possible to implement a feedback system in order to either reduce or cancel out frequency fluctuations. To succeed with the compensation of the frequency fluctuations of a given resonator it is necessary to know some of its properties, such as the quality factor Q and the resonant frequency $f_0$. These parameters are fundamental to calculate the excitation frequencies $f_1$ and $f_2$ which are used to drive the resonator. Once excitation frequencies $f_1$ and $f_2$ are applied near resonance, their time-varying phase responses are readout. The correlation between time-varying phase responses indicates both the nature and the temporal location of the dominating sources of instabilities, which are either frequency fluctuations or additive noise. With the location of frequency fluctuations regime preponderance, and with some processing it is then possible to enable a compensation loop.

The present invention provides numerous advantages. This method is not bound or limited to any technology of resonators. As previously mentioned, any resonator part of an oscillator may benefit from this technique. Whether the resonator is electronic, mechanical or optical the method remains valid. In the case of M-NEMSs, the method does not require extensive knowledge on the particular dynamics of this type of devices. To further this, the method is perfectly complementary to the Allan Deviation. Ultimately, the method is not only capable of providing a temporal dynamics of the noise sources but also capable to discriminate them.

An object of the invention is then a method of characterizing frequency fluctuations of a resonator having a resonant frequency $f_0$, comprising the steps of:

a) driving the resonator by simultaneously applying (at least) two periodical driving signals having respective frequencies $f_1$, $f_2$, said frequencies being different from each other, but contained within a resonance linewidth of the resonator;

b) performing simultaneous measurements of response signals of said resonator at the frequencies $f_1$, $f_2$, of said periodical driving signals; and c) computing a value representative of a correlation between said measurements, said value being indicative of frequency fluctuations of the resonator.

This value characterizes the stability of the resonator and allows stabilizing its frequency fluctuations.

The resonance linewidth is defined as $f_0/Q$, where Q is the quality factor of the resonator.

According to particular embodiments of the invention:

Step a) may comprise driving the resonator in a linear regime.

Frequencies $f_1$ and $f_2$ may be both different from the resonant frequency $f_0$.

Step b) may comprise measuring time-varying phases of said response signals at the frequencies $f_1$, $f_2$ of said periodical driving signals.

The method may further comprise a step b'), carried out before step c), of performing filtering of said time-varying phases. In particular, said filtering may be a band-pass filtering.

Step b) may comprise performing a plurality of measurements of the time-varying phases of the response signals at said frequencies $f_1$, $f_2$ using different integration times $\tau_i$; the method may further comprise a step of performing band-pass filtering of each measured time-varying phase using a filter whose bandwidth is centered on a frequency inversely proportional to the respective integration time; and step c) may comprise computing a value representative of a correlation between band-pass filtered time-varying phases of said spectral components of the resonance signal for each integration time. Moreover, the method may further comprise a step d) of using the value computed during step c) for determining a range of integration times wherein the response signal of the resonator is dominated by frequency fluctuations thereof; and a step e) of performing a feedback-loop control on the resonant frequency of the resonator within a frequency range corresponding to said range of integration times.

Step c) may comprise converting the measured time-varying phases to time-varying frequency values using a frequency-phase relationship of said resonator, and computing a correlation thereof.

The method may further comprise performing closed-loop control of the frequencies of the periodical driving signals using the respective measured time-varying phases as feedback signals, and step c) may comprise computing a correlation of said frequencies.

Said simultaneous measurements may be performed by heterodyne detection.

Said simultaneous measurements may be performed by homodyne detection.

Said resonator is a MEMS and/or NEMS—which includes Micro-Nano Optical Electro-Mechanical Systems (M-NEMS and/or M-NOEMS)

Another object of the invention is an apparatus for characterizing frequency fluctuations of a resonator comprising:

a driving signal generation, configured for simultaneously generating at least the two periodical driving signals at different frequencies $f_1$, $f_2$, said frequencies being different from each other, but contained within a resonance linewidth of the resonator; and applying them to the resonator;

at least one sensing device, configured for performing simultaneous measurements of response signal of said resonator at the frequencies $f_1$, $f_2$ of said periodical driving signals; and a signal processor, configured for computing a value representative of a correlation between said measurements, said value being indicative of frequency fluctuations of the resonator.

According to particular embodiments of the invention:

The sensing device may be configured for measuring time-varying phases of said response signals at the frequencies of said periodical driving signals.

The signal processor may be configured for performing filtering of said time-varying phases. More particularly, said filtering may be a band-pass filtering.

The sensing device may be configured for performing a plurality of measurements of the time-varying phases of said response signals at the frequencies of said periodical driving signals using different integration times $\tau_i$; the signal processor may be configured for performing band-pass filtering of each measured time-varying phase using a filter whose bandwidth is centered on a frequency inversely proportional to the respective integration time; and for computing a value representative of a correlation between band-pass filtered time-varying phases of said spectral components of the resonance signal for each integration time. The signal processor may be further configured for determining a range of integration times wherein the response signal of the resonator is dominated by frequency fluctuations thereof, the apparatus further comprising a feedback loop controller configured for controlling the resonant frequency of the resonator within a frequency range corresponding to said range of integration times.

The signal processor may be configured for converting the measured time-varying phases to time-varying frequency values using a frequency-phase relationship of said resonator, and computing a correlation thereof.

The apparatus may further comprise two feedback loops configured for performing closed-loop control of the frequencies of the periodical driving signals using the respective measured time-varying phases as feedback signals, and wherein the signal processor is configured for computing a correlation of said frequencies.

BRIEF DESCRIPTION OF THE DRAWINGS

A more complete understanding of the present disclosure thereof may be acquired by referring to the following description taken in conjunction with the accompanying drawings wherein.

DETAILED DESCRIPTION

While the present invention is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

Figure 1:
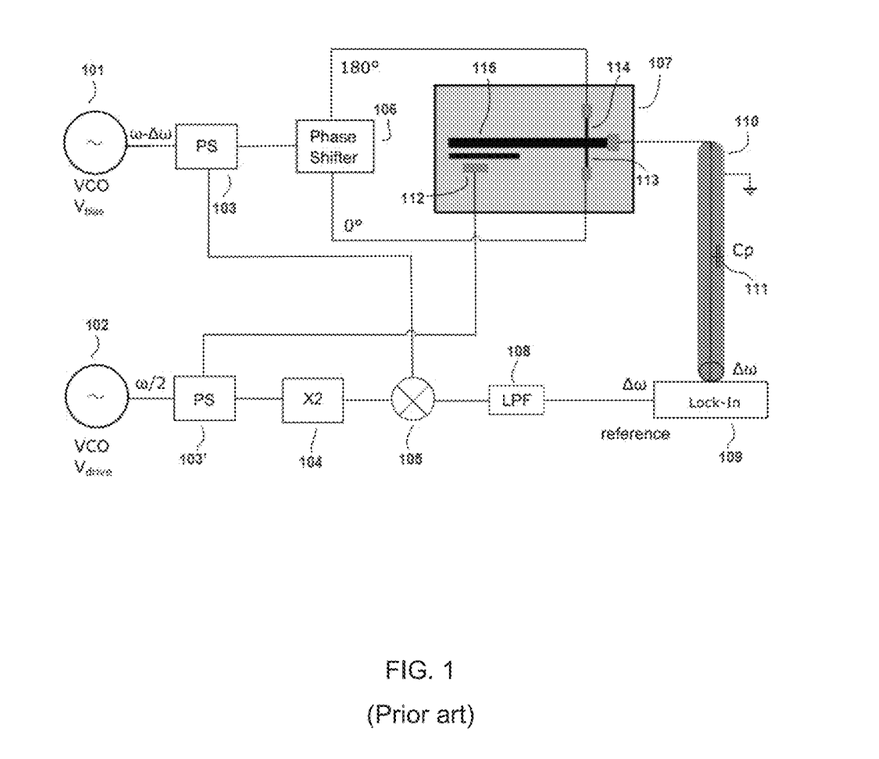
FIG. 1 is a generic heterodyne apparatus for M-NEMS resonators frequency response measurement.

FIG. 1 is a generic schematic representation of the experimental setup used for detecting the resonant motion of a NEMS in prior art "In-plane nanoelectromechanical resonators based on silicon nanowire piezoresistive detection", E. Mile et al. Nanotechnology, 2010, vol. 21 no 16, p. 165504. The NEMS 107 is composed by a fixed-free lever beam 115 and two piezoresistive gauges 113 and 114 anchoring the lever. The actuation of the NEMS is performed with the pad 112 by means of a signal at angular frequency $\omega/2$ coming from the drive VCO (Voltage Controlled Oscillator) 102 and PS (Power Splitter) 103'. The drive signal is set to the angular frequency $\omega/2$ which is half of the actuation frequency in order to reduce parasitic signals. The two gauges 113 and 114 are receiving a signal that passed through the phase shifter 106 such as their respective signals have a relative phase of 180°. The phase shifter incoming signal is generated by the bias VCO 101. The bias signal's angular frequency is $\omega-\Delta\omega$ where $\omega$ is the actuation frequency and $\Delta\omega$ an arbitrary readout angular frequency. The piezoresistive gauges behave such as they convert the stress applied to the lever into a resistance variation. They alternatively operate in tensile and compressive strain allowing an improved dynamic range. Meaning there is an enhanced rejection of the background. The heterodyne architecture is performing a $2\omega$ down-mixing operation with notably, the mixer 105 and the frequency doubler 104 thus the term $2\omega$. The output of the mixer 105 is filtered with the LPF (Low Pass Filter) 108 to only keep the information at angular frequency $\Delta\omega$. Requirement for such architecture is explained by the need to be far away from the cut off frequency formed by the NEMS parasitic capacitance, the coaxial cable 110 capacitance 111 and the readout instrument Lock-In 109 input impedance. The $2\omega$ down-mixing also improves cross-talk.

Figure 2:
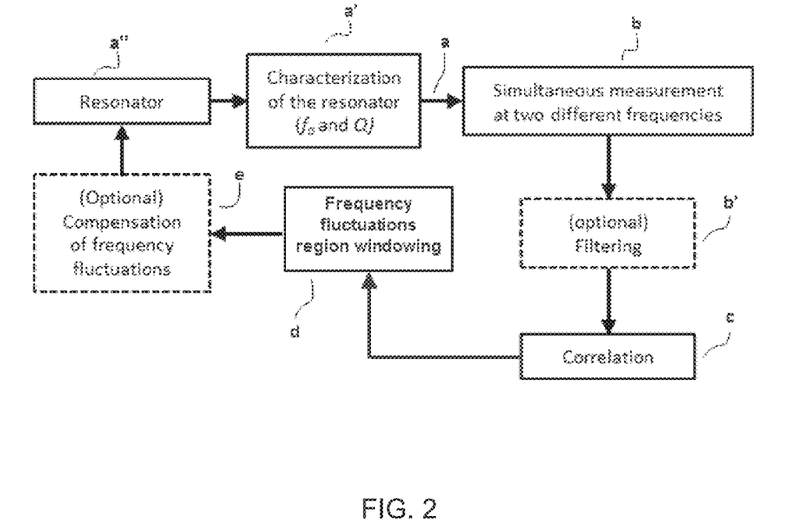
FIG. 2 is a schematic flow diagram illustrating steps of a method to distinguish additive noise from frequency fluctuations and to implement a compensation apparatus of the latter, according to a specific embodiment of the present invention.

FIG. 2 is a flow diagram showing the major steps of an exemplary embodiment of a method in accordance with the present invention. At step a" of the method of FIG. 1 a resonator is selected, i.e., the resonator may be electronic, mechanical, optical or any combination of the three. The method described herein is applied to a NEMS or MEMS resonator and is as follows:

- At step a', the resonator parameters such as the quality factor Q and the resonant frequency $f_0$ are measured. In another embodiment, said resonator parameters may be obtained from the datasheet, the manufacturer or any other means.

- Step a consists in driving the resonator, preferably but not necessarily in a linear regime, with two periodical signals having respective frequencies $f_1$ and $f_2$. The excitation frequencies are different from each other. These frequencies are within a certain linewidth when compared to the resonant frequency: the choice of the two excitation frequencies is defined such as they are sufficiently close to the resonance; one of them may indeed coincide with the resonant frequency $f_0$. In one embodiment of the invention, the choice of the excitation frequencies is such as they are chosen to be contained in a frequency range that is within 1% of the resonant frequency. This guarantees a steep, and almost linear, phase spectral response of the resonator, where its measurement is the most sensitive.

Figure 5:
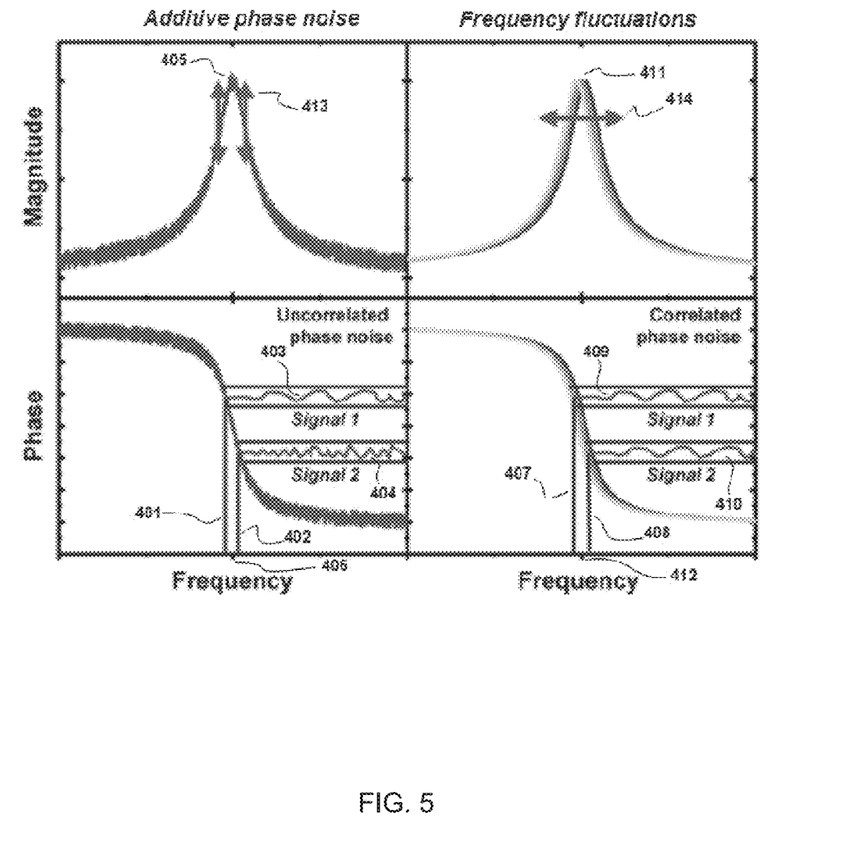
FIG. 5 top windows are representations of additive phase noise and frequency fluctuations effects on the magnitude spectrum of the resonance. Bottom windows show the phase response to two excitation frequencies around the resonance during phase spectrum observation of the resonance. Representations are according to a specific embodiment of the present invention.

- Step b consists in performing a plurality of measurements of the time-varying phase spectral response to said frequency excitations with simultaneous excitation of the resonator at frequencies $f_1$ and $f_2$. A closed-loop control of the frequencies of the periodical driving signals uses the respective time-varying phases as feedback signals. Said responses are measured and integrated for samples of duration Said excitations and responses are illustrated in FIG. 5.

- An optional step b' consists in filtering the time-varying phases occurs. It allows keeping relevant information for the computation of a value representative of the data correlation. Other embodiments may not include filtering. In such case any frequency fluctuations contribution will appear on the data. Among them, frequency drift caused by temperature fluctuations which is a deterministic slow-varying process and may mislead data interpretation.

- Step b, possibly supplemented by the filtering step b', results in a pair of resonant frequency traces $f_1$ and $f_2$, each of length N.

- Step c is the computation of a value representative of the data correlation; said correlation being indicative of frequency fluctuations of the resonator.

Different types of band-pass filtering can be performed on the data. In one embodiment of the invention, the filtering of the data is performed with the band-pass filter of the Allan deviation, of the form:

$$|H_A(f)|^2 = \frac{2\sin^4 \pi \tau f}{(\pi \tau f)^2} \qquad (1)$$

where f is the center frequency of the band-pass filter, said center frequency f being inversely proportional to the integration time $\tau_1$.

Use of a low-pass or high-pass filter is also possible, albeit less preferred.

The computation of the value representative of the correlation of traces can be determined using a variety of methods. These include, by way of example (and not of a limiting nature), the Pearson's correlation coefficient and the Spearman's rank correlation coefficient.

A step c of computing a value representative of a correlation between band-pass filtered measurements of time-varying phase values of spectral component for each integration time.

Figure 3:
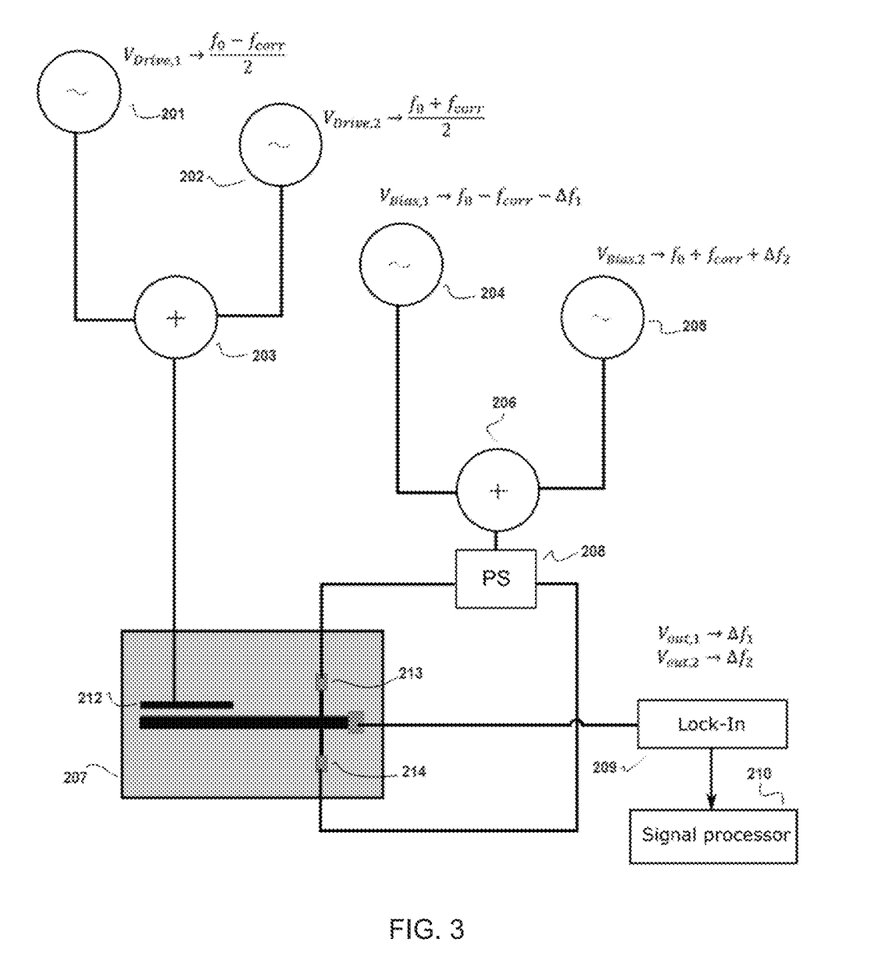
FIG. 3 is the adaptation of FIG. 1 setup for simultaneous measurement of the two phase traces. Representations are according to a specific embodiment of the present invention.

In one embodiment of the invention the method to measure the correlation is the Pearson's correlation coefficient, which is defined as:

$$\text{corr}_{f_1 f_2} = \frac{\sum_{i=1}^{N}(f_{1,i} - \bar{f}_1)(f_{2,i} - \bar{f}_2)}{N s_{f_1} s_{f_2}} \qquad (2)$$

where $\bar{f}_1$ and $\bar{f}_2$ are sample means of $f_1$ and $f_2$ respectively, $S_{f_1}$, $S_{f_2}$ are their standard deviations and N is representing the number of data points. If filtering step is performed, equation. 2 is applied for each integration time $\tau_1$. The apparatus used to perform the correlation is shown in FIG. 3.

A step d of determining a range of integration times wherein response signal of the resonator is dominated by frequency fluctuations. This is the first step towards enabling frequency fluctuations compensation by utilizing time-varying frequency values of the correlation to discriminate regions where frequency fluctuations are not dominating. This steps occurs if a filtering step was performed.

A step e of performing a feedback-loop control on the resonant frequency of the resonator within a frequency range corresponding to said range of integration times of step d. This further and terminates the compensation of the frequency fluctuations.

FIG. 3 illustrates one embodiment of the object of the invention with the apparatus used for the detection of two time-varying phase traces. It consists of a driving signal generator configured for the simultaneous generation of two driving signals 201 and 202 which are respectively $V_{Drive,1}$ and $V_{Drive,2}$ and associated to the frequencies $f_1$ and $f_2$. The two driving signals are then summed by the adder 203 in order to actuate the resonator. The two driving signals are used to actuate the resonator 207 on the side-gate 212. Similarly to the driving signals, two signals are generated to bias the gauges 213 and 214. $V_{Bias,1}$ and $V_{Bias,2}$ are respectively generated by signal generators 204 and 205. Bias signals are also summed by the adder 206 before going through the phase shifter 208. The phase shifter sets a relative phase difference of 180° between the two bias signals. $f_{corr}$ represents the separation of each measurement signal from the resonant frequency while $\Delta f_1$ and $\Delta f_2$ are the frequencies of the output signals of the resonator. These frequencies are different in order to be readout by the sensing device. Said sensing device 209 is then used for performing simultaneous measurements of the resonator at two the different frequencies. Wherein sensing device is also configured for performing a plurality of measurements of time-varying phases of both spectral components of the resonance signal using different integration time $\tau_1$. In another embodiment, the detection apparatus may contain more than one sensing device. In the present invention, the sensing device is a Lock-In Amplifier.

A signal processor 210 is for computing a value representative of a correlation between said measurements, with a value being indicative of the frequency fluctuations of the resonator. A signal processor includes, by way of example (and not of a limiting nature), a DSP (Digital Signal Processing) pertinently programmed. Said signal processor is also performing band-pass filtering of said time-varying phases. Wherein signal processor is performing band-pass filtering of the measured time-varying phase signals with a filter centered on a frequency inversely proportional to their respective integration time $\tau_1$. The signal processor in one embodiment of the present invention is configured to compute a representative value of the correlation between band-pass filtered time-varying phases for each integration time.

In another embodiment, the signal processor is configured to determine a range of integration times wherein the response of the resonator's signal is dominated by frequency fluctuations. The signal processor is further configured to convert measured time-varying phases into time-varying frequency values, and then compute said correlation.

Figure 4:
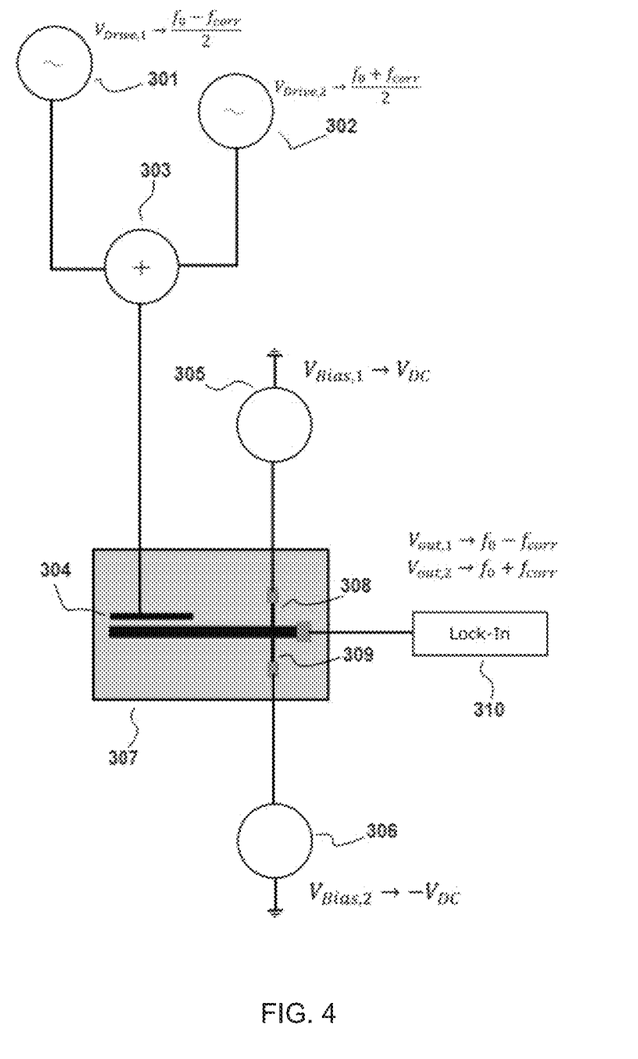
FIG. 4 is the representation of the homodyne correlation measurement setup according to a specific embodiment of the present invention.

In another embodiment the correlation measurement is performed with a homodyne apparatus. FIG. 4 is the representation of the homodyne apparatus configured for the measurement of the resonator when driven at $f_0 + f_{corr}$ and $f_0 - f_{corr}$ and reading the output at the same frequency. Then a selective filter is used for the separation of the two measurement signals. Said filter is for example a digital filter processing data either in real time or post-processing. When compared to the apparatus of FIG. 3, the homodyne setup is also composed by two generating driving signals 301 and 302 that are summed with the adder 303 and actuate the resonator 307 side-gate 304. The main difference between the two measurement systems concerns the bias 305 and 306 voltage signals of the gauges 308 and 309. Biases are DC (Direct Current) voltage signals and are directly connected to the gauges. The constant bias voltage results in the generation of the response signals at the actuation frequency (i.e. homodyne readout). The sensing device 310 remains identical to the one of FIG. 3.

FIG. 5 is a representation of the effects of additive phase noise sources on the resonances 405 and 411. Top windows are representing the spectral magnitude of the resonance 405 with superimposition of the effect of additive white noise and the effects of frequency fluctuations on the spectral magnitude of the resonance 411. The effect of said noise is the manifestation of spurs 413 on the amplitude of the resonance, while frequency fluctuations effects are shifts 414 of the resonance along an axis parallel to the frequency axis. For additive white noise, excitation frequencies mentioned in the description of FIG. 2 are represented by 401 and 402 along with their respective time-varying phase responses 403 and 404. In this exemplary embodiment, the excitation frequencies are on both sides of the resonant frequency 406 but this is not essential—they could as well be on the same side of the resonance peak. Such excitation frequencies are located in the linear region of the phase spectral response of the resonator, where its sensitivity is the highest. On the one hand, additive white noise is an uncorrelated process, thus its associated time-varying phase responses are uncorrelated. On the other hand frequency fluctuations processes are correlated and therefore their associated time-varying phase responses are correlated too. This is one of the reasons for which the interpretation of the correlation is easier if the resonator is driven in its linear regime.

Figure 6:
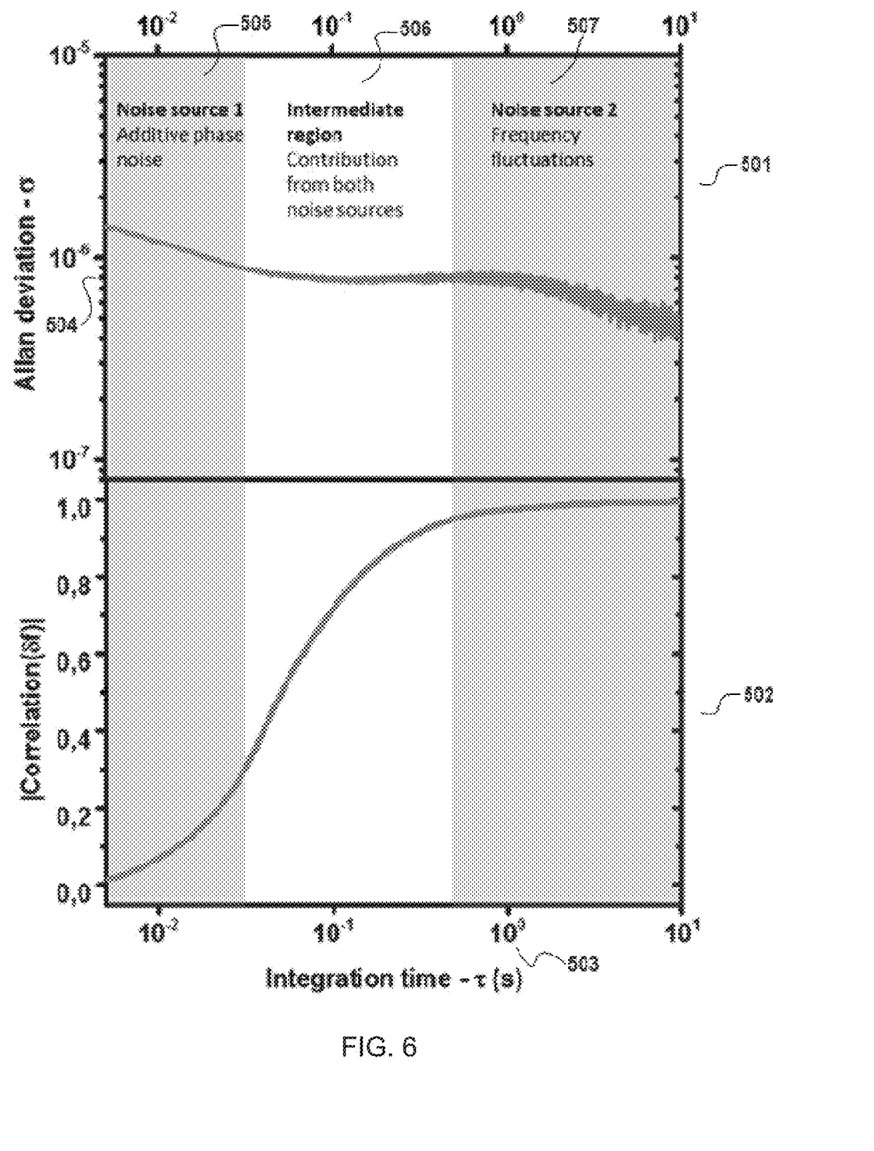
FIG. 6 upper part shows the computation of the Allan deviation while the bottom part shows the result of the correlation technique used in the present invention to distinguish frequency fluctuations from additive phase noise.

FIG. 6 is a representation of both the Allan deviation 501 and the result of the filtered correlation method 502 used in the present invention. The plot is divided in three regions of noise source dominant contribution. The first region is dominated by additive phase noise source 505, while the third region is dominated by frequency fluctuations noise source 507. Between these two regions, an intermediate region 506 is the contribution of a combination of the first and third noise sources. At 1 second integration time 503, the Allan deviation shows a frequency stability of about $8.10^{-6}$ 504 but it does not provide any information on the origin of the noise source contributing to the frequency stability degradation. The correlation method on the other hand does not quantify the frequency stability, but it shows the frequency stability is limited by the resonator's frequency fluctuations 507. Shorter integration time tends to show effects of rapidly-varying phenomena such as for example additive white noise. This would occur at high Fourier frequencies of the phase spectral density, thus the thermal floor or so-called white noise. In contrast, regions of longer integration time suggest phenomena occurring at lower Fourier frequencies, for example near the carrier of a phase spectral density measurement, therefore near the resonance. The Allan deviation and the correlation method of the present invention are complementary as they provide a diagnostic tool to both quantify frequency stability but also identify the incriminated noise source.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure. The true scope and spirit of the invention is indicated by the following claims.

The invention claimed is:

1. A method of characterizing frequency fluctuations of a resonator having a resonant frequency $f_0$ utilizing a frequency fluctuation characterization apparatus, comprising the steps of:
a) generating simultaneously, with at least one signal generator, two periodical driving signals having respective frequencies $f_1$, $f_2$, said frequencies being different from each other, but contained within a resonance linewidth of the resonator, generating a resonator drive signal responsive to the two periodical driving signals, and driving the resonator with the resonator drive signal;
b) performing simultaneous measurements of a response signal of said resonator at the frequencies $f_1$, $f_2$, of said periodical driving signals, comprising measurements of time-varying phases of the response signal, with a signal sensing device; and
c) computing a correlation between said measurements with a signal processor responsive to the signal sensing device, said correlation being indicative of frequency fluctuations of the resonator, said correlation being utilized in a feedback system to control a resonant frequency of the resonator to compensate for the frequency fluctuations.

2. The method of claim 1 wherein step a) comprises driving the resonator in a linear regime.

3. The method of claim 1 wherein the frequencies $f_1$ and $f_2$ are both different from the resonant frequency $f_0$.

4. The method of claim 1, further comprising a step b'), carried out before step c), of performing filtering of said time-varying phases.

5. The method of claim 4 wherein said filtering is a band-pass filtering.

6. The method of claim 1, wherein:
step b) comprises performing a plurality of measurements of the time-varying phases of the response signal at said frequencies $f_1$, $f_2$ using different integration times $\tau_1$ and performing band-pass filtering of each measured time-varying phase using a filter whose bandwidth is centered on a frequency inversely proportional to the respective integration time; and
step c) comprises computing a correlation between band-pass filtered time-varying phases of said spectral components of the resonance signal for each integration time.

7. The method of claim 6 further comprising:
a step d) of using the value computed during step c) for determining a range of integration times wherein the response signal of the resonator is dominated by frequency fluctuations thereof; and
a step e) of performing a feedback-loop control on the resonant frequency of the resonator within a frequency range corresponding to said range of integration times.

8. The method of claim 1, wherein step c) comprises converting the measured time-varying phases to time-varying frequency values using a frequency-phase relationship of said resonator, and computing a correlation thereof.

9. The method of claim 1, further comprising performing closed-loop control of the frequencies of the periodical driving signals using the respective measured time-varying phases as feedback signals, and wherein step c) comprises computing a correlation of said frequencies.

10. The method of claim 1 wherein said simultaneous measurements are performed by heterodyne detection.

11. The method of claim 1 wherein said simultaneous measurements are performed by homodyne detection.

12. The method of claim 1 wherein said resonator is a MEMS and/or NEMS.

13. An apparatus for characterizing frequency fluctuations of a resonator comprising:
a driving signal generator configured for simultaneously generating at least the two periodical driving signals at different frequencies $f_1$, $f_2$, said frequencies being different from each other, but contained within a resonance linewidth of the resonator;
a circuit configured to receive the two periodical driving signals and based on the two periodical driving signals generate a resonator drive signal and provide the resonator with the resonator drive signal;
at least one sensing device, configured for performing simultaneous measurements of a response signal of said resonator at the frequencies $f_1$, $f_2$ of said periodical driving signals, and configured for measuring time-varying phases of the response signal; and
a signal processor, configured for computing a correlation between said measurements of a response signal of said resonator, said correlation being indicative of frequency fluctuations of the resonator, said correlation being utilized in a feedback system to control a resonant frequency of the resonator to compensate for the frequency fluctuations.

14. The apparatus of claim 13, wherein the signal processor is configured for performing filtering of said time-varying phases.

15. The apparatus of claim 14 wherein said filtering is a band-pass filtering.

16. The apparatus of claim 13, wherein:
the sensing device is configured for performing a plurality of measurements of the time-varying phases of said response signal at the frequencies of said periodical driving signals using different integration times $\tau_f$;
the signal processor is configured for performing band-pass filtering of each measured time-varying phase using a filter whose bandwidth is centered on a frequency inversely proportional to the respective integration time; and for computing a value representative of a correlation between band-pass filtered time-varying phases of said spectral components of the resonance signal for each integration time.

17. The apparatus of claim 16 wherein the signal processor is further configured for determining a range of integration times wherein the response signal of the resonator is dominated by frequency fluctuations thereof, the apparatus further comprising a feedback loop controller configured for controlling the resonant frequency of the resonator within a frequency range corresponding to said range of integration times.

18. The apparatus of claim 13, wherein the signal processor is configured for converting the measured time-varying phases to time-varying frequency values using a frequency-phase relationship of said resonator, and computing a correlation thereof.

19. The apparatus of claim 13 further comprising two feedback loops configured for performing closed-loop control of the frequencies of the periodical driving signals using the respective measured time-varying phases as feedback signals, and wherein the signal processor is configured for computing a correlation of said frequencies.

* * * * *